United States Patent
Long et al.

(10) Patent No.: US 9,293,353 B2
(45) Date of Patent: Mar. 22, 2016

(54) FARADAY SHIELD HAVING PLASMA DENSITY DECOUPLING STRUCTURE BETWEEN TCP COIL ZONES

(71) Applicants: Maolin Long, Cupertino, CA (US); Alex Paterson, San Jose, CA (US); Ricky Marsh, San Ramon, CA (US); Ying Wu, Dublin, CA (US); John Drewery, Santa Clara, CA (US)

(72) Inventors: Maolin Long, Cupertino, CA (US); Alex Paterson, San Jose, CA (US); Ricky Marsh, San Ramon, CA (US); Ying Wu, Dublin, CA (US); John Drewery, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 606 days.

(21) Appl. No.: 13/658,652

(22) Filed: Oct. 23, 2012

(65) Prior Publication Data
US 2013/0186568 A1 Jul. 25, 2013

Related U.S. Application Data

(63) Continuation-in-part of application No. 13/198,683, filed on Aug. 4, 2011.

(60) Provisional application No. 61/480,314, filed on Apr. 28, 2011.

(51) Int. Cl.
*C23C 16/00* (2006.01)
*H01L 21/306* (2006.01)
(Continued)

(52) U.S. Cl.
CPC ..... *H01L 21/67069* (2013.01); *H01J 37/32651* (2013.01); *H05K 9/00* (2013.01)

(58) Field of Classification Search
CPC ............... H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H01J 37/32651
USPC ....... 118/723 I, 723 IR, 723 AN; 156/345.48, 156/345.49; 315/111.51
See application file for complete search history.

(56) References Cited

U.S. PATENT DOCUMENTS 4,633,812 A 1/1987 Fujiyama
4,918,031 A 4/1990 Flamm et al.
(Continued)

FOREIGN PATENT DOCUMENTS

| EP | 0 801 413 A1 | 10/1997 | |
|---|---|---|---|
| TW | 340295 | 9/1998 | ............... H05H 1/00 |
| TW | 200635446 A | 10/2006 | ............... H05H 1/24 |

OTHER PUBLICATIONS

Singapore Search Report, 201307543-7, pp. 1-8, May 13, 2014.
(Continued)

*Primary Examiner* — Luz Alejandro Mulero
(74) *Attorney, Agent, or Firm* — Martine Penilla Group, LLP (57) ABSTRACT

A Faraday shield and a plasma processing chamber incorporating the Faraday shield is are provided. The plasma chamber includes an electrostatic chuck for receiving a substrate, a dielectric window connected to a top portion of the chamber, the dielectric window disposed over the electrostatic chuck, and a Faraday shield. The Faraday shield is disposed inside of the chamber and defined between the electrostatic chuck and the dielectric window. The Faraday shield includes an inner zone having an inner radius range that includes a first and second plurality of slots and an outer zone having an outer radius range that includes a third plurality of slots. The inner zone is adjacent to the outer zone. The Faraday shield also includes a band ring separating the inner zone and the outer zone, such that the first and second plurality of slots do not connect with the third plurality of slots.

10 Claims, 9 Drawing Sheets

(51) Int. Cl.
  *H01L 21/67* (2006.01)
  *H05K 9/00* (2006.01)
  *H01J 37/32* (2006.01)

(56) References Cited

U.S. PATENT DOCUMENTS

| | | | |
|---|---|---|---|
| 5,525,159 | A | 6/1996 | Hama et al. |
| 5,540,800 | A | 7/1996 | Qian |
| 5,571,366 | A * | 11/1996 | Ishii et al. ............... 156/345.26 |
| 5,622,635 | A | 4/1997 | Cuomo et al. |
| 6,033,585 | A * | 3/2000 | Wicker et al. ................... 216/68 |
| 6,250,563 | B1 | 6/2001 | Frank et al. |
| 6,280,563 | B1 | 8/2001 | Baldwin, Jr. et al. |
| 6,367,412 | B1 | 4/2002 | Ramaswamy et al. |
| 6,422,173 | B1 | 7/2002 | Nakajima |
| 6,474,258 | B2 | 11/2002 | Brcka ........................ 118/723 I |
| 6,503,364 | B1 | 1/2003 | Masuda et al. |
| 6,523,493 | B1 * | 2/2003 | Brcka ........................ 118/723 I |
| 6,531,030 | B1 | 3/2003 | Nakajima |
| 6,666,982 | B2 | 12/2003 | Brcka |
| 7,223,321 | B1 * | 5/2007 | Comendant et al. ...... 156/345.48 |
| 7,413,673 | B2 | 8/2008 | Lohokare et al. |
| 2001/0022158 | A1 | 9/2001 | Brcka ........................ 118/723 I |
| 2003/0015293 | A1 * | 1/2003 | Obuchi ................... 156/345.48 |
| 2003/0075349 | A1 | 4/2003 | Kruse et al. |
| 2003/0159782 | A1 * | 8/2003 | Brcka ........................ 156/345.48 |
| 2004/0163595 | A1 | 8/2004 | Edamura et al. ............ 118/723 I |
| 2004/0194890 | A1 | 10/2004 | Moroz |
| 2005/0103444 | A1 | 5/2005 | Brcka |
| 2005/0103445 | A1 | 5/2005 | Brcka |
| 2006/0130758 | A1 | 6/2006 | Lohokare et al. .............. 118/715 |
| 2006/0169669 | A1 | 8/2006 | Zojaji et al. ..................... 216/58 |
| 2007/0113981 | A1 | 5/2007 | Brcka |
| 2007/0181257 | A1 | 8/2007 | Comendant et al. ..... 156/345.48 |
| 2007/0238199 | A1 | 10/2007 | Yamashita ........................ 438/5 |
| 2008/0135518 | A1 * | 6/2008 | Chen et al. ...................... 216/67 |
| 2010/0230050 | A1 * | 9/2010 | Kim ........................ 156/345.33 |
| 2011/0204023 | A1 * | 8/2011 | Huh et al. ....................... 216/37 |
| 2011/0297320 | A1 * | 12/2011 | Sakka et al. ............. 156/345.48 |

OTHER PUBLICATIONS

Taiwan Search Report, 102138117, p. 5 from Examination Opinions, Nov. 10, 2014.
U.S. Appl. No. 10/345,582, filed Jan. 15, 2003, Comendant et al.
U.S. Appl. No. 13/198,683, filed Aug. 4, 2011, Drewery et al.
U.S. Appl. No. 13/896,175, filed May 16, 2013, Sant et al.
U.S. Appl. No. 13/974,324, filed Aug. 23, 2013, Sriraman et al.
PCT International Search Report and Written Opinion of the International Searching Authority (ISA) issued in International Application No. PCT/US2012/034837, ISA/US Commissioner for Patents, Apr. 24, 2012.
Mahoney et al., Electron-density and energy distributions in a planar inductively.

* cited by examiner

FARADAY SHIELD HAVING PLASMA DENSITY DECOUPLING STRUCTURE BETWEEN TCP COIL ZONES

PRIORITY CLAIM

This application claims priority as a Continuation-in-Part of U.S. patent application Ser. No. 13/198,683, filed on Aug. 4, 2011, and entitled "Internal Faraday Shield Having Distributed Chevron Patterns and Correlated Positioning Relative to External Inner and Outer TCP Coil, which claims priority to U.S. Provisional Patent Application No. 61/480,314 filed on Apr. 28, 2011 and entitled "Internal Faraday Shield Having Distributed Chevron Patterns and Correlated Positioning Relative to External Inner and outer TCP Coil," all of which are incorporated herein by reference in their entirety for all purposes.

FIELD OF THE INVENTION

The present invention relates generally to semiconductor fabrication, and more particularly, to an apparatus containing a Faraday shield for improving etch chamber plasma uniformity.

DESCRIPTION OF THE RELATED ART

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma etching apparatus.

A plasma contains various types of radicals, as well as positive and negative ions. The chemical reactions of the various radicals, positive ions, and negative ions are used to etch features, surfaces and materials of a wafer. During the etching process, a chamber coil performs a function analogous to that of a primary coil in a transformer, while the plasma performs a function analogous to that of a secondary coil in the transformer.

The reaction products generated by the etching process may be volatile or non-volatile. The volatile reaction products are discarded along with used reactant gas through the gas exhaust port. The non-volatile reaction products, however, typically remain in the etching chamber. The non-volatile reaction products may adhere to the chamber walls and a dielectric window. Adherence of non-volatile reaction products to the window may interfere with the etching process. Excessive deposition may result in particles flaking off the window onto the wafer, thus interfering with the etching process. Excessive deposition, therefore, requires more frequent cleaning of the chamber walls and the window which adversely affects wafer throughput. Additionally, if the window becomes coated with etch byproducts, the ability of the chamber transmit sufficient magnetic flux to the plasma becomes diminished, which in turn reduces the ability to control the directionality of etch operations, which are critical when processing high aspect ratio profile features.

In view of the foregoing, there is a need for an apparatus and methods for protecting a process chamber's dielectric window, while maintaining the ability to transmit sufficient levels of magnetic flux to the plasma.

SUMMARY

Disclosed is an apparatus used in etching semiconductor substrates and layers formed thereon during the manufacturer of semiconductor devices. The apparatus is defined by a chamber in which etching is performed. The apparatus includes a chuck for supporting a substrate to be etched, connections to RF power and ground, a dielectric window located in an upper roof section of the chamber and a radio frequency (RF) coil disposed over the dielectric window. Further disposed within the chamber is a Faraday shield.

Plasma processing chambers having internal Faraday shields with defined groove configurations are provided. In one example, the chamber includes an electrostatic chuck for receiving a substrate and a dielectric window connected to a top portion of the chamber, where the dielectric window is disposed over the electrostatic chuck.

In one embodiment, a Faraday shield disposed inside of the chamber, and is defined between the electrostatic chuck and the dielectric window. The Faraday shield includes an inner zone and an outer zone, where the inner zone is separated from the outer zone by a band ring, that enables further improves decoupling of the plasma density control between the outer zone and the inner zone. This decoupling allows for independent control of the magnetic field distribution seen by the plasma that is applied to the wafer. The Faraday shield includes radial slots in each of the zones. Broadly speaking, the radial slots of the Faraday shield can be viewed as divide between the slots outside of the ring band and the slots inside of the ring band 167. In essence, the ring band provides the ability to separately control the magnetic flux provided to the substrate when different voltages are applied via the inner and outer coils of the chamber.

In another embodiment, a Faraday shield and a plasma processing chamber incorporating the Faraday shield is are provided. The plasma chamber includes an electrostatic chuck for receiving a substrate, a dielectric window connected to a top portion of the chamber, the dielectric window disposed over the electrostatic chuck, and a Faraday shield. The Faraday shield is disposed inside of the chamber and defined between the electrostatic chuck and the dielectric window. The Faraday shield includes an inner zone having an inner radius range that includes a first and second plurality of slots and an outer zone having an outer radius range that includes a third plurality of slots. The inner zone is adjacent to the outer zone. The Faraday shield also includes a band ring separating the inner zone and the outer zone, such that the first and second plurality of slots do not connect with the third plurality of slots.

Thus, as feature sizes continue to decrease to the low nanometer process nodes and beyond (and wafers continue to increase in size), it is imperative that better plasma density control is provided across the surface of the wafer. The Faraday shield embodiments described herein provide such improvements, which enable control of plasma density uniformity within a plasma etching chamber, while providing the benefits of having a Faraday shield protect the dielectric window from plasma byproduct buildup during etching operations.

BRIEF DESCRIPTION OF THE DRAWINGS

The invention, together with further advantages thereof, may best be understood by reference to the following description taken in conjunction with the accompanying drawings.

FIGS. 6A-6C-2 illustrates the decoupling and control of the magnetic field distribution, when different voltages are applied between the inner and outer TCP coils, and the resulting illustration of the decoupling control provided by the Faraday shield in accordance with one embodiment of the present invention.

DETAILED DESCRIPTION

Disclosed is an apparatus used in etching semiconductor substrates and layers formed thereon during the manufacture of semiconductor devices. The apparatus is defined by a chamber in which etching is performed. A Faraday shield is disposed within the chamber, and is configured with a three zone slot configuration that is correlated to the placement of a TCP coil disposed over a dielectric window of the chamber.

In one embodiment, the Faraday shield includes a band ring that is used to physically separate slot openings in an inner region of the Faraday shield from slot openings in an outer region of the Faraday shield. The band ring, in one embodiment, provides for improved decoupling control of the applied magnetic flux imparted by the inner and outer coils, respectively. The band ring is a plasma density decoupling structure, that is integral to the Faraday shield. The decoupling provides for an improved tuning knob, which may be used to achieve desired etch uniformities (e.g., center-to-edge uniformity tuning). Still further, this additional knob provides for even better control in large wafer processing, such as 300 mm, 450 mm wafers, and beyond.

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

In the following embodiments, examples will be provided regarding use cases and the Faraday shield configuration that enables improved processing of wafers substrates in etch chambers that utilize the Faraday shield embodiment.

In an inductively coupled plasma etch module comprising a planar window and a generally planar excitation coil, adapted for etching metals that resist dry etching, a slotted shield is disposed inside the process module, between the insulating vacuum barrier window and the process space. This shield comprises a metal, preferably copper or aluminum. The shield preferably contains multiple radial slots that penetrate the thickness of the shield. Preferably, the slots provide that there is no line of sight through the shield, and are optimized to capture non-volatile material that originates from the process space by such material adhering to the inner walls of the slots. Furthermore the number and physical dimensions of the slots are optimized to provide maximum penetration of alternating magnetic fields generated by the excitation coils through the shield, simultaneously with good thermal uniformity of the shield, the ability to control the temperature rise in the shield, and mechanical rigidity. The shield is preferably coated on all facets facing the process space with a rough coating or applied texture, to improve adhesion of deposited material.

The shield may be galvanically connected to earth, isolated, or powered using a suitable AC or DC power source. If isolated or powered, the shield may comprise a conducting, slotted portion mounted in an insulating structure that prevents unintended electrical shorting of the conducting portion to other components of the system. Such a shield may comprise multiple separate parts or may be bonded into a single unit. In one embodiment, the Faraday shield installed within the chamber as defined herein is optimized for highly demanding etch applications. Without limitation, such etch applications include etching device features in the making of magneto-resistive random access memory (MRAM) devices. In this configuration, the Faraday shield is grounded and is well configured to block capacitive coupling during operation.

Also, since the capacitive coupling has been reduced to the plasma, this has the added advantage that the Plasma potential is reduced and subsequently the electron temperature of the plasma is reduced. This "Cooling" of the plasma may be beneficial for plasma processing, as it will benefit soft etch applications where Si recess is presently at issue.

The design of the Faraday shield internal to the chamber can be used in an inductively coupled plasma reactor to etch materials like, Pt, Ir, PtMn, PdCo, Co, CoFeB, CoFe, NiFe, W, Ag, Cu, Mo, TaSn, Ge2Sb2Te2, InSbTe Ag—Ge—S, Cu—Te—S, IrMn, Ru. The concept can be extended to materials like NiOx, SrTiOx, Perovskite (CaTiO3), PrCAMnO3, PZT (PbZr1-xTixO3), (SrBiTa) O3 to keep the dielectric window clean of any deposition. The process can be combined with a suitable dry plasma clean process to keep the surface of the shield clean and control plasma drift. The internal Faraday shield could be used with any gas combination that is available in a present day fab (including CO, NH3, CH3OH+std. gases). Again, the internal Faraday shield can be grounded, floating or powered as required in order to meet process needs.

Figure 1A:
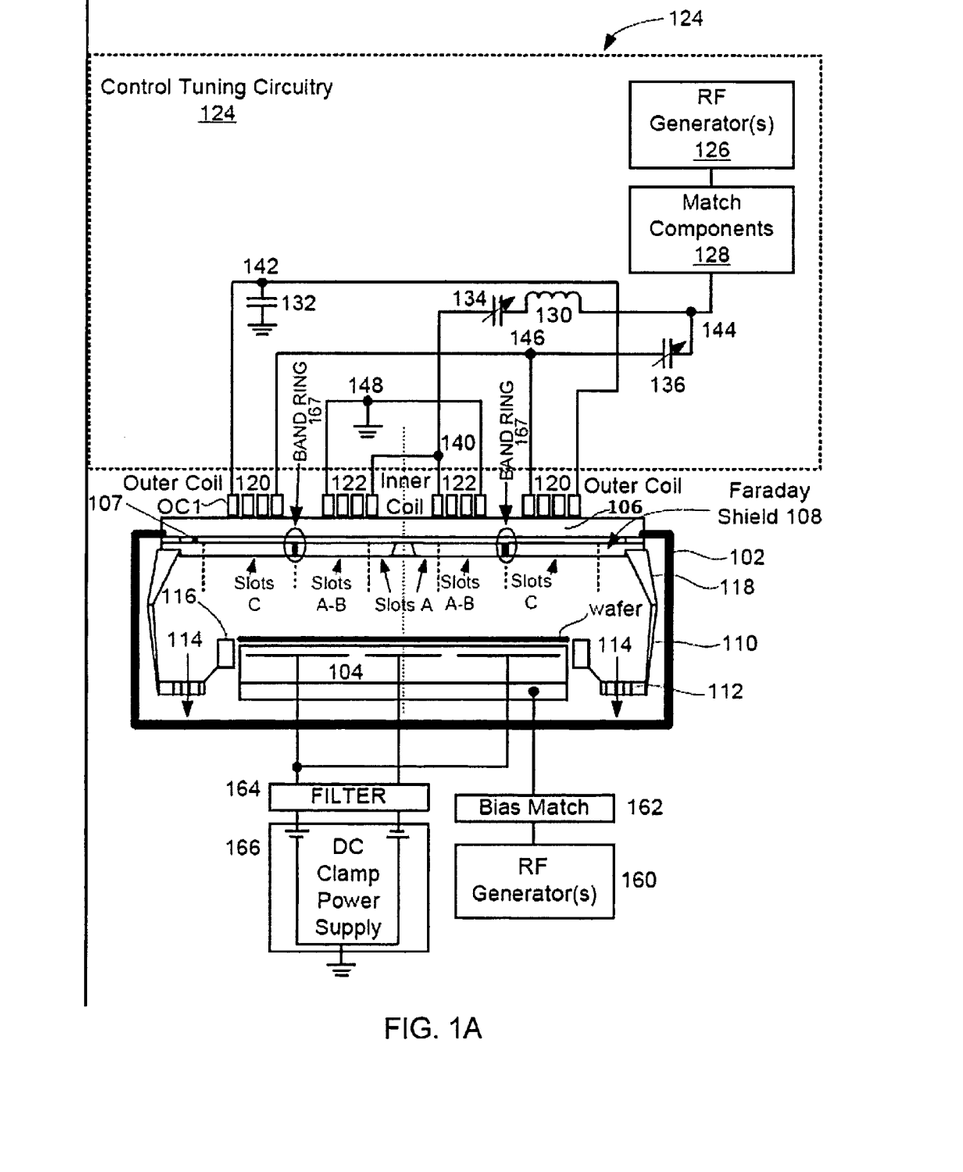
FIG. 1A illustrates a plasma processing system utilized for etching operations, in accordance with one embodiment of the present invention.

FIG. 1A illustrates a plasma processing system utilized for etching operations, in accordance with one embodiment of the present invention. The system includes a chamber 102 that includes a chuck 104, a dielectric window 106, and a Faraday shield 108. The chuck 104 can be an electrostatic chuck for supporting the substrate when present. Also shown is an edge ring 116 that surrounds chuck 104, and has an upper surface that is approximately planar with a top surface of a wafer, when present over chuck 104. Chamber 102 also includes a lower liner 110 that is coupled to an upper liner 118. The upper liner 118 is configured to support the Faraday shield 108. In one embodiment, the upper liner 118 is coupled to ground and therefore provides ground to the Faraday shield 108. A space 107 is provided between the Faraday shield 108 and the dielectric window 106. As shown, the Faraday shield 108 is divided in to a plurality of zones.

Further shown is a bias RF generator 160, which can be defined from one or more generators. If multiple generators are provided, different frequencies can be used to achieve various tuning characteristics. A bias match 162 is coupled between the RF generators 160 and a conductive plate of the assembly that defines the chuck 104. The chuck 104 also includes electrostatic electrodes to enable the chucking and dechucking of the wafer. Broadly, a filter 164 and a DC clamp power supply is provided. Other control systems for lifting the wafer off of the chuck 104 can also be provided. Although not shown, pumps are connected to the chamber 102 to enable vacuum control and removal of gaseous byproducts from the chamber during operational plasma processing. As noted above, the Faraday shield in one embodiment is grounded by way of its connection to the grounded chamber wall.

The zones, in one embodiment, are divided into three sections. The inner zone will include slots A and slots A-B, and the outer zone will include slots C, as will be explained in more detail below. The Faraday shield 108 preferably includes a plurality of radial slots that are defined by grooves machined into a Chevron pattern. In one embodiment, the chevron grooves can be between 0.1 mm and 10 mm wide and between 0.1 mm and 5 mm deep. As noted above, the chevron pattern is configured to prevent a direct line of sight to the processing material in the chamber during plasma processing, such as etching. By providing the chevron pattern, the Faraday shield 108 is configured to protect the surface of the dielectric window 106, during operation. The dielectric window 106 is preferably separated from the Faraday shield 108 by a space 107, as noted above. The Faraday shield 108 is disposed above the chuck 104, which also operates as a bottom electrode.

The Faraday shield has a central region that will allow a showerhead to deliver process gases into the processing volume of the chamber 102. Additionally, other probing apparatus can also be disposed through the Faraday shield 108 near the central region, where the whole is provided. The probing apparatus can be provided to probe process parameters associated with the plasma processing system, during operation. Probing processes can include endpoint detection, plasma density measurements, ion density measurements, and other metric probing operations. As shown, the Faraday shield has an inner zone includes slots A and slots A-B, and an outer region that includes slots A. The inner zone and the outer zone separated by a band ring, which is a structural part of the Faraday shield material that is not machined with slots. Each of the slots defined in the Faraday shield 108 are configured in a radial pattern that emanate from the center of the circular shaped Faraday shield 108. The circular shape of the Faraday shield 108 is defined due to the geometry of a typical wafer, which is usually circular. As is well known, wafers typically are provided in various sizes, such as 200 mm, 300 mm, 450 mm, etc.

Additionally, other shapes are possible for square type substrates or smaller substrates, depending on the etching operations performed within chamber 102. In the preferred embodiment, the Faraday shield 108 will be provided as a circular type shield, that will resemble the circular shape of a typical semiconductor wafer substrate.

Disposed above the Faraday shield 108 is the dielectric window 106. As noted above, the dielectric window 106 can be defined from a ceramic type material. Other dielectric materials are also possible, so long as they are capable of withstanding the conditions of a semiconductor etching chamber. Typically, chambers operate at elevated temperatures ranging between about 50 Celsius and about 120 Celsius. The temperature will depend on the etching process operation and specific recipe. The chamber 102 will also operate at vacuum conditions in the range of between about 1 mTorr (mT) and about 100 mTorr (mT). Although not shown, chamber 102 is typically coupled to facilities when installed in a clean room, or a fabrication facility. Facilities include plumbing that provide processing gases, vacuum, temperature control, and environmental particle control.

These facilities are coupled to chamber 102, when installed in the target fabrication facility. Additionally, chamber 102 may be coupled to a transfer chamber that will enable robotics to transfer semiconductor wafers into and out of chamber 102 using typical automation.

Continuing with reference to FIG. 1A, the TCP coil is shown to include an inner coil (IC) 122, and an outer coil (OC) 120. The TCP coil is placed and arranged over the dielectric window 106, which is respectively placed over the Faraday shield 108. In one embodiment, the positioning of the inner coil 122 and the outer coil 120 is specifically adjusted to correlate to the location of the zones in the Faraday shield 108. For example, the outer zone of the Faraday shield 108 will be substantially positioned below the outer coils 120, of the TCP coil. The inner coil 122 of the TCP coil is positioned substantially over the inner zone of the Faraday shield 108.

The correlation between the placement of the TCP coil inner structure and outer structure is strategically defined relative to the radial zones of the Faraday shield 108, so as to achieve a tuning between the Faraday Shield 108 structure and control tuning circuitry unit 124. By tuning the placement, and power delivered to the TCP coil, relative to the zones in the Faraday shield 108, it is possible to reduce the deposition of particulates on to the exposed surface of the Faraday shield 108, within chamber 102. In addition, it is also possible to control the magnetic flux delivered to the plasma by the coils from the inner and outer zones. The ring band 167, which will be described below in more detail, further assists in decoupling the magnetic flux provided through the inner and outer zones, which provides for improved tunability.

In one embodiment, the TCP coil is coupled to the control tuning circuitry 124 which includes connections to the inner coil 120, and outer coil 122. As shown, the outer coil 120 inner terminals are coupled to node 146, which in turn connects to variable capacitor 136. Variable capacitor 136 is disposed between node 146 and 144, before connecting to match components 128 and RF generators 126. The outer terminals of the outer coil 120 are connected to node 142, which connects to capacitor 132. Capacitor 132 is coupled between ground and node 142. The inner coil 122 has its inner terminals connected to node 140, which then connects to variable capacitor 134.

Variable capacitor 134 is coupled between node 140 and inductor 130 that is coupled to node 144. The inner terminals of inner coil 122 is coupled to node 148. Node 148 couples to ground. Control tuning circuitry 124 therefore enables dynamic tuning of variable capacitors 134 and 136 to tune the power provided to the inner and outer coils when placed over the Faraday shield 108 having the above noted three zones.

In one embodiment, the control tuning circuitry 124 is configured to tune the TCP coil to provide more power to the inner coil 122 versus the outer coil 120. In another embodiment, the control tuning circuitry 124 is configured to tune the TCP coil to provide less power to the inner coil 122 versus the outer coil 120. In another embodiment, the power provided to the inner coil and the outer coil will be to provide an even distribution of power and/or control the ion density in a radial distribution over the substrate (i.e., wafer, when present). In yet another embodiment, the tuning of power between the outer coil and the inner coil will be adjusted based on the processing parameters defined for that etching being performed on the semiconductor wafer disposed over chuck 104.

In one implementation, a circuit having two variable capacitors is configured to be adjusted automatically to achieve a predetermined ratio of currents in the two coils. It should be understood that the circuits illustrated herein are only exemplary and other circuit configurations will also work to provide tuning and adjustment to the desired ratio of currents. In one embodiment, the ratio of currents can range from 0.1 to 1.5. Commonly, this ratio is referred to as the transformer coupled capacitive tuning (TCCT) ratio. The setting of the TCCT ratio, however, is based on the process that is desired for a particular wafer or wafers.

It should be appreciated that by providing a tunable TCP coil over a partitioned Faraday shield 108, the chamber 102 can provide more flexibility for controlling ion density versus TCP power, and radial ion density profiles, depending on the processing operations being performed. Additionally, by controlling the power to the TCP coil relative to the zones in the Faraday shield 108, it is possible to control and prevent a desired amount of deposition onto the inner surface of the Faraday shield 108, during processing. For instance, certain processing operations will tend to deposit more polymers or etching residues onto the exposed surfaces of the Faraday shield 108, within the chamber 102. In such cases, the control tuning circuitry 124 can be adjusted to influence less sputtering or deposition upon the exposed surfaces of Faraday shield 108.

In one embodiment, the capacitors 134 and 136 are controlled by processing controllers, connected to the electronics panel of chamber 102. The electronics panel can be coupled to networking systems that will operate specific processing routines that depend on the processing operations desired during specific cycles. The electronics panel can therefore control the etching operations performed in chamber 102, as well as control the specific settings of capacitors 134 and 136.

Figure 1B:
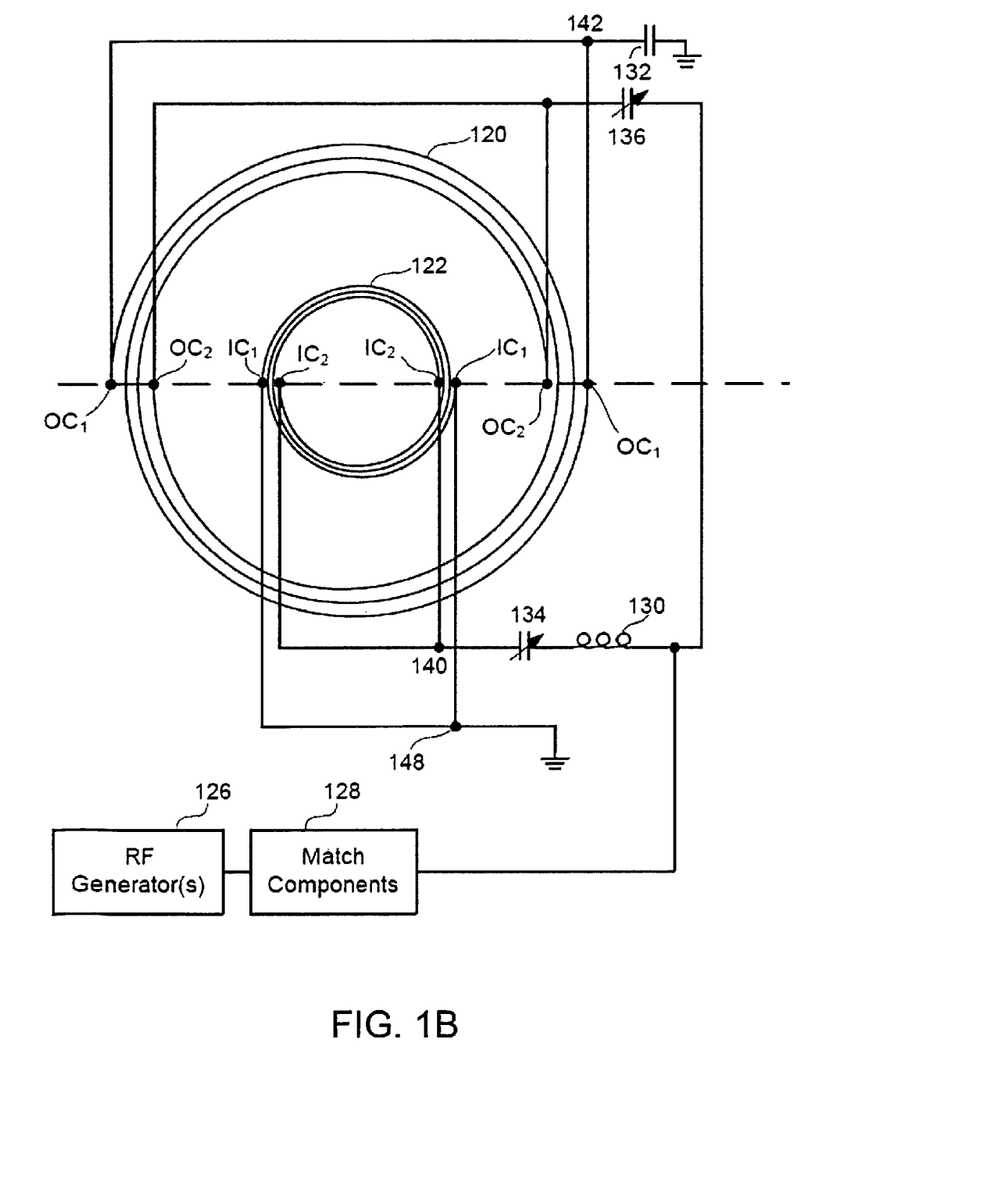
FIG. 1B illustrates a top view, schematically representing the inner coil and outer coil, in accordance with one embodiment of the present invention.

FIG. 1B illustrates a top view, schematically representing the inner coil 122 and outer coil 120, in accordance with one embodiment of the present invention. The top view shown in FIG. 1B represents the connections to the coil in FIG. 1A, as one example. The inner coil 122 will include an inner coil 1 and inner coil 2. The outer coil 120 includes an outer coil 1 and an outer coil 2. The connections between the coil ends are illustrated relative to the circuitry provided in the control tuning circuitry 124, as shown in FIG. 1A. The illustration in FIG. 1B was provided to show the circular winding associated with each of the inner and outer coils of the TCP coil utilized in chamber 102, in accordance with one embodiment of the present invention. It should be appreciated that other types of coil configurations are possible. It is possible to have a dimensional coil that provides a dome type structure, and other coil type structures other than flat coil distributions. Depending on the configuration associated with the geometry of the TCP coil, the specific zones in the Faraday shield 108 can be adjusted.

Figure 2:
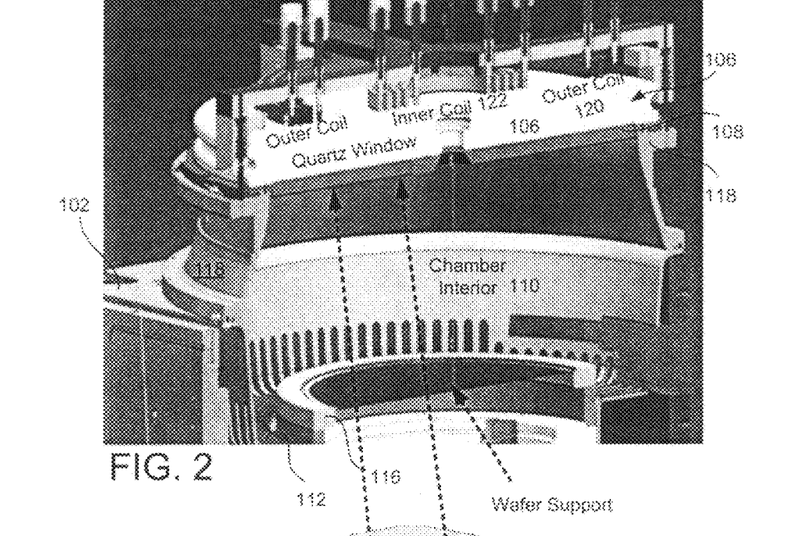
FIG. 2 illustrates a three-dimensional view of chamber, in accordance with one embodiment of the present invention.

FIG. 2 illustrates a three-dimensional view of chamber 102, in accordance with one embodiment of the present invention. As shown, chamber 102 will include the wafer support 104, also referred to as a chuck or a bottom electrode, or a support. The focus ring 116 is also illustrated in FIG. 2, as well as a perforated plasma confinement ring 112 that enables removal of plasma byproducts from the chamber during operation, as illustrated by flow lines 114. Although not illustrated, connections are provided to chamber 102 to remove the byproducts during operation, using a variety of pump configurations which are well known in the art.

The three-dimensional view of the chamber 102 also illustrates the sidewalls of the lower liner 110 which include a plurality of slots to allow the flow of plasma byproducts during operation, while still confining the plasma over the surface of the substrate. Further illustrated is the upper liner 118 that has a tapered structure. The upper liner 118 is also commonly referred to as the "pinnacle." The upper liner 118, is preferably connected to ground, as is chamber 102. Upper liner 118 provides the structure for supporting the Faraday shield 108 in a tight relationship to the upper liner 118. The tight relationship is preferably established by O-rings that ensure proper connection between the Faraday shield 108 and the upper liner 118, while still providing for electrical conduction to provide ground to the Faraday shield 108. As illustrated, the dielectric window 106 (preferably a quartz window) is provided over the Faraday shield 108.

The three-dimensional view of FIG. 2 also illustrates the placement of the outer coil 120 and the inner coil 122. Electrical connections are also shown made to the inner and outer coils, which allow for interconnection to the control tuning circuitry 124. The control circuitry 124 can include the RF generators 126 and match components 128, or these components can be external to the control tuning circuitry 124. The configuration of the tuning circuitry can be defined using separate circuitry and/or software that is interfaced to controlling systems of chamber 102.

Figure 3:
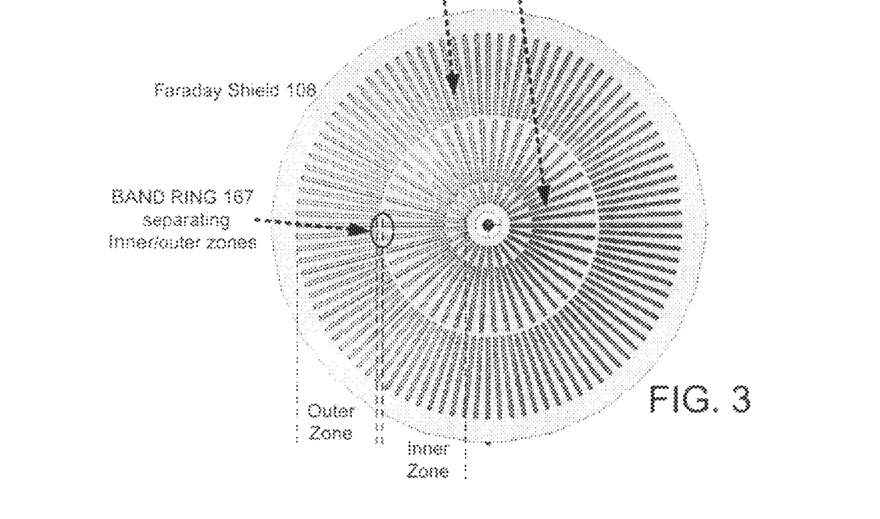
FIG. 3 illustrates a top view of the Faraday shield having a band ring, in accordance with one embodiment of the present invention.

FIG. 3 illustrates a bottom view of Faraday shield 108, which is exposed to the inner region of chamber 102, in accordance with one embodiment of the present invention. In describing the Faraday shield 108, the drawings make reference to the term "FSU". The term FSU is simply a short hand reference to Faraday shield 108. As mentioned above, the Faraday shield has two separate zones of slots. One zone of slots is in the inner zone and one zone of slots in the outer zone. The arrangement of the slots on the FSU can decouple the magnetic flux generation in vacuum excited by the inner coil and outer coil, respectively. In one embodiment, the inner zone and the outer zone are separated by a ring band 167, which physically separates the slots of the outer zone from the inner zone. The physical separation is defined by having material of the Faraday shield remain and not removed by slots. In this manner, the slots from the outer and inner zones of the Faraday shield 108 are isolated from one another.

In one embodiment, for a 300 mm wafer chamber, the Faraday shield 108 has band ring 167 width of between about 1 mm and 15 mm, and in another embodiment the width is between about 2 mm and 10 mm, and in another embodiment the width is set to about 5 mm. In one embodiment, the width of band ring 167 is kept as small as possible to allow for sufficient transmission of magnetic flux from the power provided by the coils. Still further, it is desired that the band ring 167 have a width that is not so large as to block enough magnetic flux that that would cause the band ring 167 to print on the substrate being processed. That is, if the band ring 167 is too wide, this width could act to block the plasma density that the wafer would otherwise see, which could potentially be seen as a non-uniform band over part of the wafer surface being processed (e.g., etched). Thus, ideally, for a 300 mm wafer system, the ring band is kept to a size that is less than 15 mm, or less than 10 mm or is about 5 mm.

If the ring band 167 has a width that is too small (or narrow), it is possible that local heating can occur near the slots that abut the band ring 167. In one embodiment, the local heating can occur due to currents transmitted in the respective outer zone and inner zones separated by the band ring 167. As such, the sizing of the ring band 167 is set to provide the separate zones for the inner and outer regions of the Faraday shield 108, while also providing for an improved ability to control uniformity tuning of magnetic flux transmission set by setting of TCCT. This tunability will be described in greater detail below, with reference to illustrated testing and modeling data.

Figure 4A:
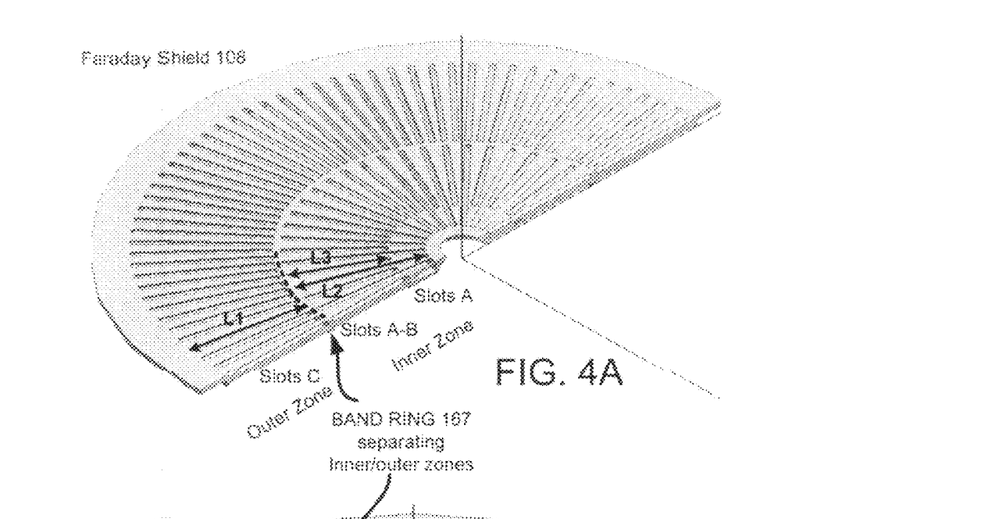
FIGS. 4A and 4B illustrate a cross-sectional view and an isometric view of the Faraday shield, in accordance with one embodiment of the present invention.
Figure 4B:
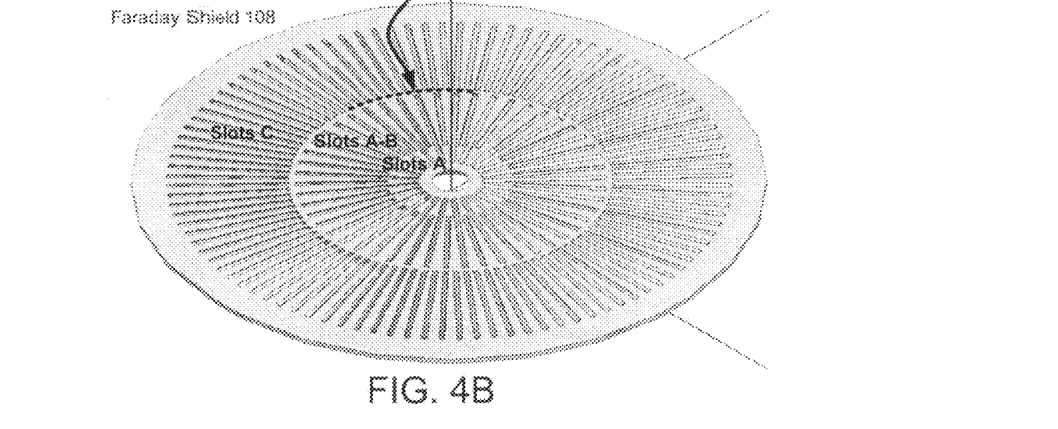

In FIG. 4A illustrates a cross-sectional view of the Faraday shield 108, in accordance with one embodiment of the present invention. In this example, the cross-sectional view shows the slots in each of the outer zone and inner zone of the Faraday shield 108. The band ring 167 is also shown separating the inner and outer zones. Also illustrated are the lengths L1, L2, and L3 for the slots. Lengths L1 are for slots C in the outer zone. In the inner zone, lengths L2 and L3 for slots A-B and A, have a staggered alternating configuration. As shown, the staggering configuration arranges slot A-B, then slot A, then slot A-B, then slot A, and so on. Thus, band ring 167 will separate lengths L1 from lengths L2 and L3. FIG. 4B provides another top view of the Faraday shield 108 with the slots A, A-B, and C. A dashed line is overlaid along the band ring 167, to illustrate its radial separation of the inner and outer zones of Faraday shield 108.

Figure 5A:
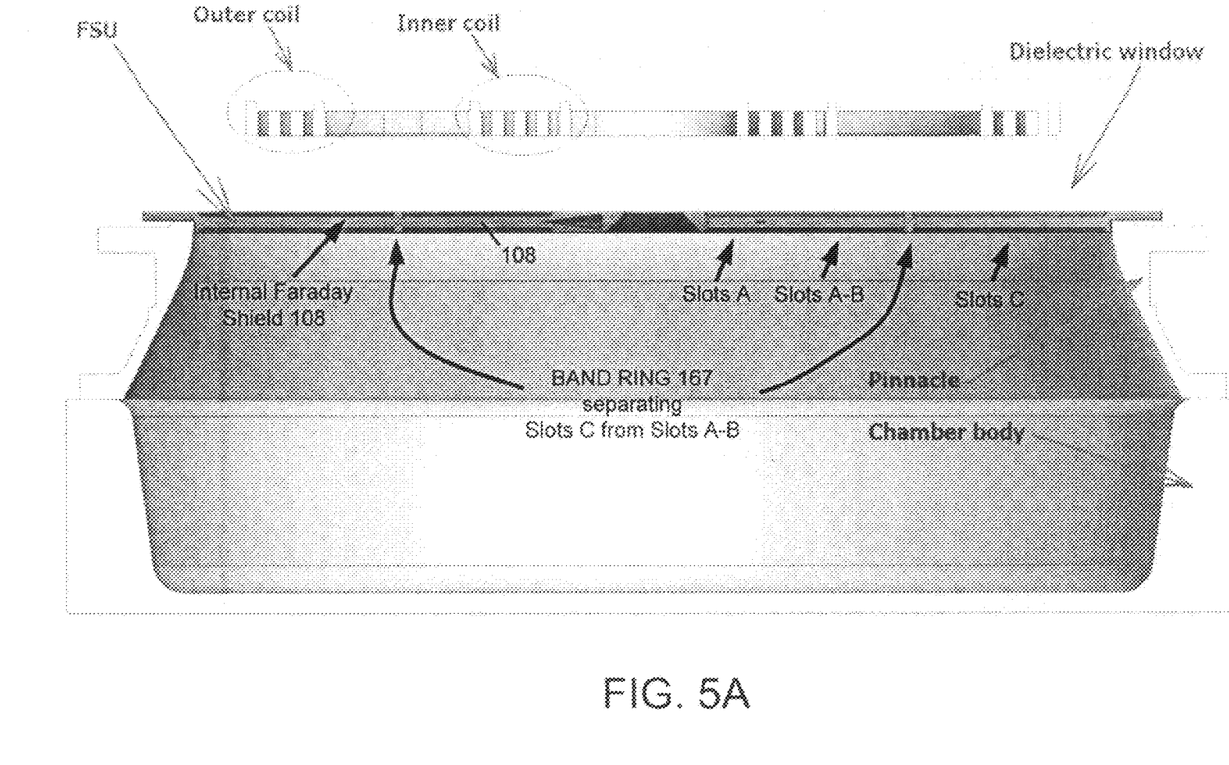
FIG. 5A illustrates a cross-sectional view of a partial chamber, including a Faraday shield having the radial slots and the band ring, in accordance one embodiment of the present invention.

FIG. 5A illustrates a cross-sectional view of a partial chamber, in accordance with one embodiment of the present invention. The partial chamber includes a body and the pinnacle section connected to the chamber body. Connected to the top ring portion of the pinnacle is Faraday shield 108. Located above Faraday shield 108 is a dielectric window. Located above the dielectric window are the inner and outer coils, which are coupled to RF power. This illustration shows the location of the band ring 167, and the separation of the outer and inner zones of the Faraday shield 108.

Figure 5B:
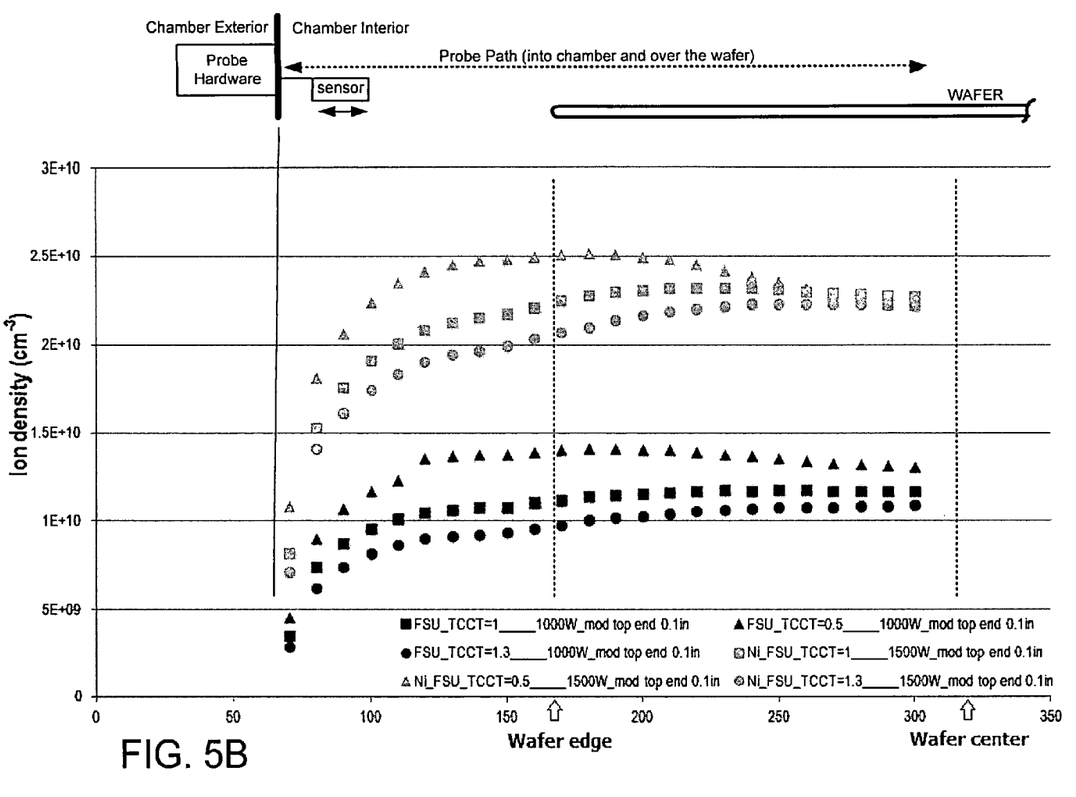
FIG. 5B illustrates a plasma density distribution profile plot for different power levels and showing the controllability of the plasma density between the center and edge of the substrate, when utilizing the Faraday shield, in accordance with one embodiment of the present invention.

FIG. 5B illustrates a plasma density distribution profile, depicting the ion density across a portion of a wafer. To generate the test data presented FIG. 5B, a probe with the sensor is placed inside of the chamber, and allowed to move across a portion of the wafer. The probe is connected to a hardware probe that sits outside of the chamber, and is allowed to expand to the interior region of the chamber and over the wafer. The probe path will expand into the chamber and over the substrate, as illustrated in FIG. 5B. The sensor will first traverse over a region within the interior of the chamber that is not over the wafer, and then over the wafer edge toward the center of the wafer. The data compiled and illustrated in 5B is for a case where the probe extends over the edge of the wafer and extends close to the wafer center. The vertical dashed lines in the test data illustrate the approximate location of the edge of the wafer and approximate location of the wafer center.

Thus, the data between the vertical lines represents the plasma density distribution profile over the wafer. Data points to the left of the first dashed vertical line represents plasma density distribution profiles for regions that are not over the wafer. As shown in FIG. 5B, 2 sets of data plots are provided for comparison purposes. The top set of data plots are for a power level of 15,000 W, which will produce a higher density plasma. The lower set of data plots are for a power level of 10,000 W, which will produce a lower density plasma.

For each power level, 3 separate TCCT settings where tested, where a square represents TCCT=1, a triangle represents TCCT=0.5 and a circle represents TCCT=1.3. As noted above, when TCCT is set to 1, a condition of equal currents in both the inner and outer TCP coil is provided. In the example of a power level of 15,000 W, it is shown that for a TCCT of 0.5, the center plasma density is lower than the edge plasma density. For a TCCT of 1.3, the center plasma density is higher than the edge plasma density. For a TCCT of 1, the center and edge plasma densities are substantially flat and equal to one another between the edge of the wafer and the center of the wafer. Thus, by choosing the correct TCCT for a given process or desired process result, the Faraday shield 108 of the present invention, allows for substantial control in tunability of the plasma density uniformity across the wafer. In the example of a power level of 10,000 W, there is slightly less variation in the plasma density between the edge and the center when TCCT is adjusted. The reason for the slightly less variation and slightly less tunability is that less plasma density is present when lower power is applied to the chamber by the TCP coils.

Figure 6A:
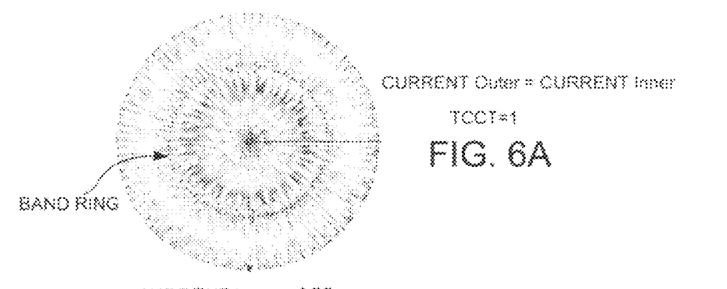

FIGS. 6A-6C-2 illustrate examples of the magnetic field distribution in vacuum at the dielectric window bottom surface, based on modeling's of the Faraday shield 108 in a chamber, in accordance with one embodiment of the present invention. In FIG. 6A, the current in the outer and inner zones of the Faraday shield 108 are said to be approximately equal, with a setting of TCCT=1. In this illustration, the modeling illustrates that the band ring 167 is slightly viewable in the modeling of the neck that field distribution, but is not sufficiently overrepresented and should not provide for unwanted printing of the band ring 167.

Figure 10A:
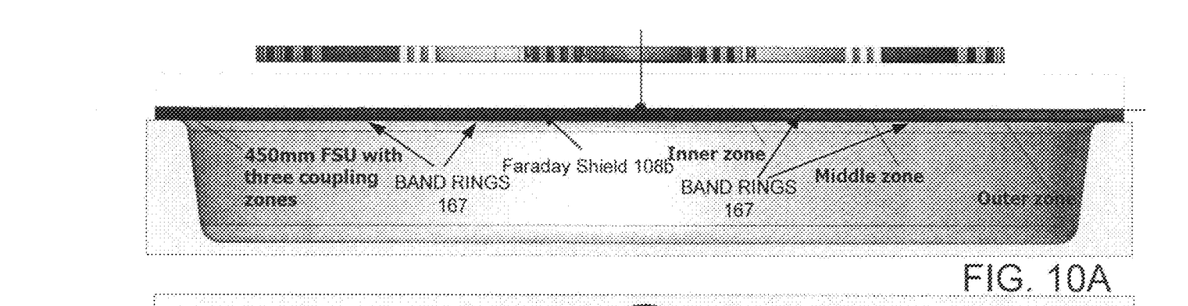
FIGS. 10A-10B illustrate examples of a larger 450 mm chamber, that utilizes a Faraday shield with three separate zones divided by band rings, in accordance with one embodiment of the present invention.
Figure 10B:
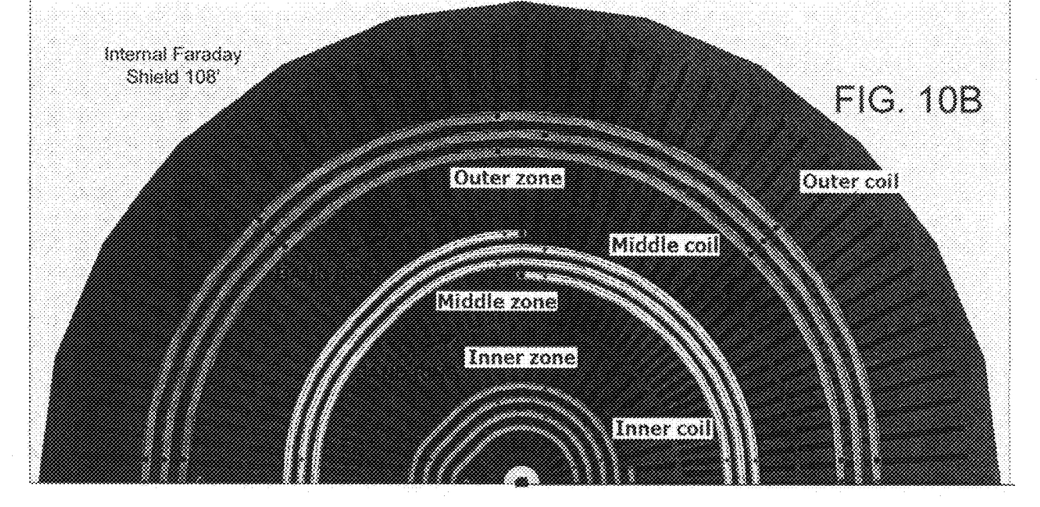

As noted above, the band ring 167 is sized to have a width that is approximately 5 mm, for embodiments where a 300 mm wafer chamber and Faraday shield are constructed. If larger wafers, such as 450 mm wafers were processed, the Faraday shield 108 would also be enlarged, such as parity shield 108' (FIGS. 10 A and 10 B). To produce the equal currents in the inner and outer zones of Faraday shield 108, the modeling set the voltage of the inner TCP coil to 250 V and the voltage of the outer TCP coil to 1000 V.

Figures 6B, 6B:
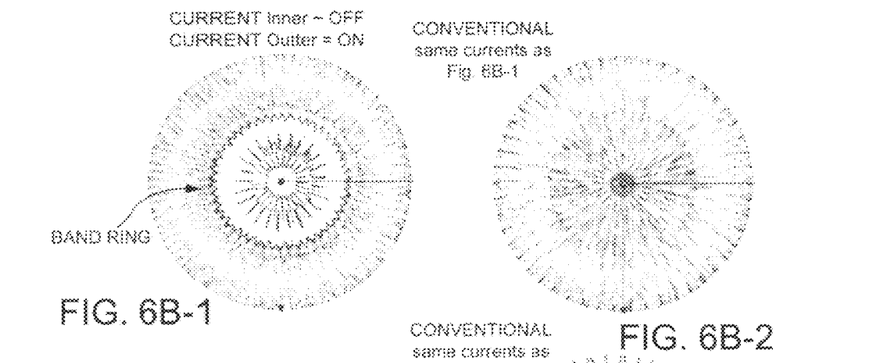

FIG. 6B-1 illustrates an example where the voltage of the inner TCP coil is reduced to 25 V, while leaving the outer TCP coil at 1000 V. The result shown is that the inner magnetic field distribution is substantially reduced in the center portion that corresponds to the Faraday shield 108. In addition, the band ring 167 is also clearly delineated in the modeling of the magnetic field distribution, which shows a substantial decoupling of the inner and outer magnetic field distributions. In contrast, FIG. 6B-2 illustrates an example of a conventional system utilizing a Faraday shield that does not include the slot configuration and band ring 167 of Faraday shield 108. The modeling illustrated in FIG. 6B-2 was provided with the same voltage levels as the modeling of FIG. 6B-1.

However, it is evident that the magnetic field distribution will still penetrate the center or inner region that corresponds to Faraday shield 108. As such, the inner and outer regions are not isolated and are not decoupled. The result is that less control is provided to process engineers that wish to set particular TCCT values to influence the uniformity of the plasma density across the wafer surface. For example, the control provided by the Faraday shield 108, as illustrated in FIG. 5B would not be possible with the configuration of conventional Faraday shields.

Figure 6C:
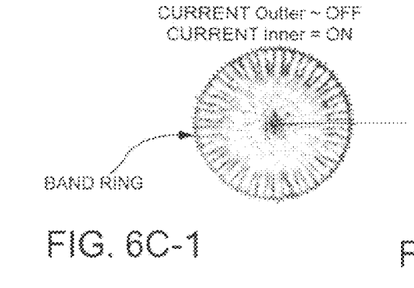
Figure 6C:
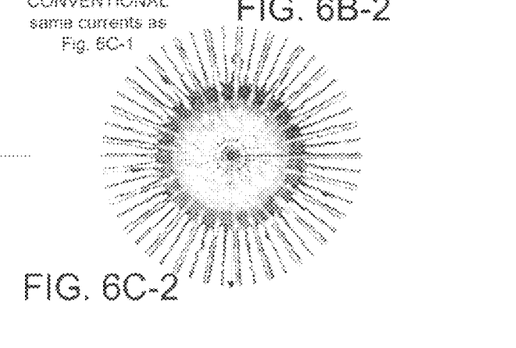

FIG. 6C-1 illustrates an example where the voltage of the inner TCP coils is set to 250 V while the voltage of the outer TCP coils is set the 10 V. The result is that the magnetic field distribution modeled by the setting, using the Faraday shield 108 will allow substantial decoupling and substantial illumination of the magnetic field distribution outside of the band ring 167. In contrast, a Faraday shield does not have the slot configuration and the band ring 167 would not be able to provide the isolation between the inner zone and outer zone. This is illustrated in FIG. 6C-2, which shows the modeling of the same voltage as used in FIG. 6C-1. Notice that the magnetic field distribution in FIG. 6C-2 is allowed to seep into the outer region. As such, no isolation nor decoupling of the magnetic field distribution between the inner and outer are possible with conventional Faraday shield designs. The results clearly show that Faraday shield 108 has a much stronger decoupling capability for the H field distribution from the inner zone to the outer zone.

Figures 7, 8:
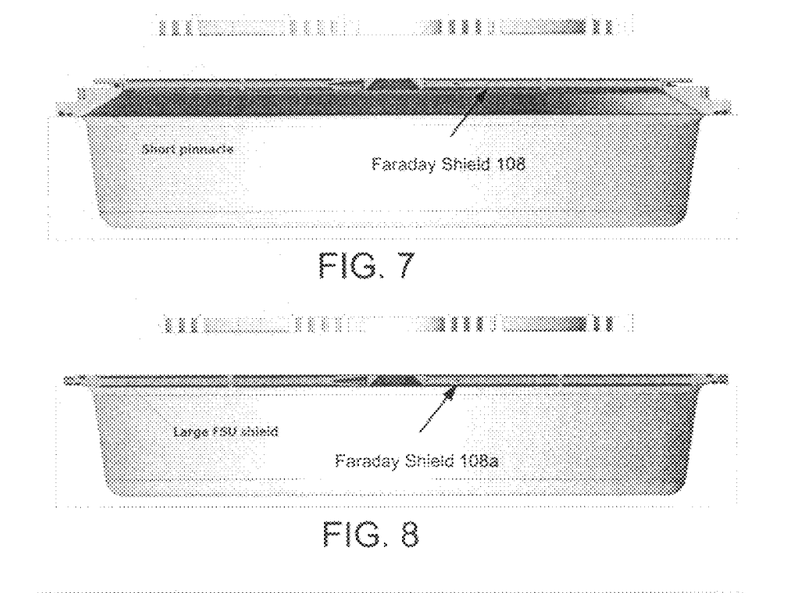
FIG. 7 illustrates an alternative embodiment of the present invention, which utilizes a short pinnacle to provide for a lower aspect ratio chamber.
FIG. 8 illustrates an alternative embodiment of the present invention, which utilizes a chamber body that does not include a pinnacle to provide an even lower aspect ratio chamber.

FIG. 7 illustrates another embodiment of the present invention, which utilizes Faraday shield 108. In this embodiment, the pinnacle section of the chamber is reduced in height (e.g., producing a lower aspect ratio chamber). The reduction in height is advantageous, because it is possible to provide increased levels of plasma using the same RF generator. That is, the space within the chamber is reduced and less power is necessary to deliver power to a smaller volume. In the same manner, a smaller volume will also provide for more simplified vacuum systems and other cost advantages. For instance, if a Faraday shield 108 were to reduce the magnetic field strength provided over the wafer, by reducing the size of the pinnacle, increased power can be transmitted to the plasma without needing to increase the size of the generators or replace other hardware. This embodiment will therefore improve the RF power efficiency of the chamber with FSU (i.e., 108) while keeping its advantage of uniformity and uniformity tuning capability.

FIG. 8 illustrates another embodiment, which can further improve the RF power efficiency by a larger sized FSU (108a), without any pinnacle. In this embodiment, a large FSU 108a sits directly on the chamber body through the chamber liner (liner between FSU and chamber body is not shown in the graph). Correspondingly, the TCP coil assembly may have a larger outer coil and a resized inner coil to tune the uniformity so that each of the inner and outer coils will be arranged in the middle of each of the inner and outer zones defined by the slot layout on the large FSU 108a for improved RF power efficiency and improved uniformity.

Figure 9:
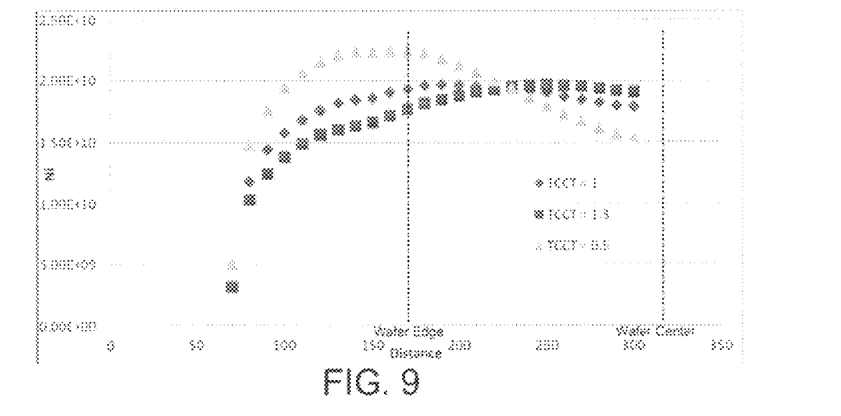
FIG. 9 illustrates plasma density plots for chambers that utilize the short pinnacle or no pinnacle, in accordance with the chambers of FIGS. 7 and 8.

FIG. 9 illustrates an example of the tunability provided by the Faraday shield 108, when the Faraday shield is enlarged as shown in FIG. 8. The tunability is still consistent with the tunability possible with standard size Faraday shield 108, as shown in FIG. 5A. Depending on the process parameters desired for a particular wafer, an engineer can set the TCCT to the appropriate level to achieve the desired plasma density uniformity across the wafer surface. Again, the controllability by using TCCT is enhanced by the Faraday shield design, which includes the slot patterns and the band ring that separates the inner and outer zones.

FIGS. 10A-B illustrates another embodiment of a Faraday shield 108b, that is increased in size for a system that will utilize 3 separate TCP coils. In this embodiment, the Faraday shield is divided into 3 zones, one zone for each coil. Each zone, in accordance with one embodiment, is separated by a band ring 167. By defining band rings 167 between the inner and middle zone, and the middle and outer zone, it is possible to control the plasma uniformity across the wafer surface, even when the wafer is increased in size. In one example, the Faraday shield 108b of FIGS. 10A and 10B are utilized in a chamber that is optimized for plasma etching of 450 mm wafers. Using this scaling convention, is possible to scale the size of a chamber to sizes that are beyond 450 mm, and respectively adding additional zones that are separated by band rings 167. Each zone is therefore provided with controllable decoupling of the magnetic field distribution, based on the voltage is provided to each of the TCP coils for each zone. Controllability similar to that described in FIG. 6 will therefore be possible, by adjusting the voltages and resulting currents according to TCCT settings.

The Faraday shield 108 is maintained at a space 107 (see FIG. 1A) between dielectric 106. The space 107 can vary between about 0.3 mm and about 1.5 mm. And preferably is set to about 0.5 mm. In one embodiment, the Faraday shield is made out of stainless steel. For example, the Faraday shield is made out of 300-series stainless steel (i.e. one of the following SS materials: 301, 301LN, 304, 304L, 304LN, 304H, 305, 312, 316, 316L, 316LN, 316Ti, 317L, 321, 321H). In one embodiment, the stainless steel Faraday shield is passivated with nitric acid for improved corrosion resistance. The Faraday shield can be made out of Hastalloy. The Faraday shield can be made out of Titanium. In this embodiment, the Titanium Faraday shield is coated with TiN for better corrosion performance. The Faraday shield can be coated with one of the following materials: Y2O3, CeO2, TiN (independent of the material of construction).

As illustrated by FIGS. 1A-10B, the Faraday shield can be configured in a variety of ways. The Faraday shields are provided as examples and should not be considered as limiting to the present invention. The number of slots, slot shapes, and slot sizes in the Faraday shields can be varied as necessary to accommodate different etching process requirements.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A plasma processing chamber, comprising:
   an electrostatic chuck for receiving a substrate;
   a dielectric window connected to a top portion of the chamber, the dielectric window disposed over the electrostatic chuck;
   a transformer coupled plasma (TCP) coil having a substantially flat coil distribution that is disposed over the dielectric window;
   a Faraday shield disposed inside of the chamber and defined between the electrostatic chuck and the dielectric window, the Faraday shield having a flat circular plate structure that is disposed under the dielectric window and inside the chamber; the Faraday shield includes,
   (a) an inner zone having an inner radius range that includes a first and second plurality of slots;
   (b) an outer zone having an outer radius range that includes a third plurality of slots, the inner zone being adjacent to the outer zone; and
   (c) a band ring separating the inner zone and the outer zone, such that the first and second plurality of slots do not connect with the third plurality of slots, wherein the inner zone and the outer zone are coupled together by way of the band ring, wherein the band ring is part of the flat circular plate structure and the band ring has a width that is less than about 15 mm, the band ring is configured to decouple magnetic flux generation and having the width of the band ring less than 15 mm acts to prevent plasma blockage under the band ring that would cause power non-uniformities to transfer to a substrate when processed in the plasma processing chamber;

wherein the first, second and third plurality of slots are arranged and extend out radially from a center of the Faraday shield, and the Faraday shield is electrically grounded.

2. The plasma processing chamber as recited in claim 1, wherein the transformer coupled plasma (TCP) coil is disposed over the dielectric window, the TCP coil includes an inner coil and an outer coil, the outer coil is disposed over the dielectric window such that the outer coil is substantially over the outer zone of the Faraday shield and the inner coil is substantially over the inner zone of the Faraday shield.

3. The plasma processing chamber as recited in claim 2, wherein the inner coil and outer coil are connected to a tuning circuit, the turning circuit being configured to adjust magnetic flux imparted through either or both of the outer zone and inner zone of the Faraday shield.

4. The plasma processing chamber as recited in claim 1, wherein each one of the slots are defined from a chevron shaped groove.

5. The plasma processing chamber as recited in claim 4, wherein the chevron shaped groove does not include a line of sight between respective sides of the Faraday shield.

6. A Faraday shield for installation inside of a chamber, comprising:
a circular plate structure having a center hole, the circular plate structure being flat and configured to be disposed inside the chamber and below a dielectric window, the circular plate structure including, (a) an inner zone having an inner radius range that includes a first and second plurality of slots;
(b) an outer zone having an outer radius range that includes a third plurality of slots, the inner zone being adjacent to the outer zone; and
(c) a band ring separating the inner zone and the outer zone, such that the first and second plurality of slots do not connect with the third plurality of slots;

wherein the inner zone and the outer zone are coupled together by way of the band ring;

wherein the band ring is part of the circular plate and the band ring has a width that is between about 1 mm and about 10 mm;

wherein the band ring is configured to decouple magnetic flux generation through each of the inner and outer zones and having the width of the band ring being less than 10 mm substantially prevents plasma blockage under the band ring that would cause power non-uniformities to transfer to a substrate when processed in the chamber;

wherein the first, second and third plurality of slots are arranged and extend out radially from a center of the Faraday shield and each slot is defined from a chevron groove, and the Faraday shield is electrically grounded.

7. The Faraday shield of claim 6, wherein the chevron shaped groove does not include a line of sight between respective sides of the Faraday shield.

8. The Faraday shield of claim 6, wherein the circular plate structure is made from stainless steel, hastalloy or titanium.

9. The Faraday shield of claim 6, wherein the circular plate structure is passivated or coated with one of Y2O3, or CeO2, or TiN.

10. The Faraday shield of claim 6, wherein the chevron grooves can be between 0.1 mm and 10 mm wide and between 0.1 mm and 5 mm deep.

\* \* \* \* \*